United States Patent
Dimitrov et al.

(10) Patent No.: US 8,053,270 B2
(45) Date of Patent: Nov. 8, 2011

(54) METHOD FOR PRODUCING SILICON SUBSTRATE FOR SOLAR CELLS

(75) Inventors: Dimitre Zahariev Dimitrov, Hsinchu (TW); Chien-Rong Huang, Hsinchu (TW); Ching-Hsi Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 814 days.

(21) Appl. No.: 12/214,183

(22) Filed: Jun. 16, 2008

(65) Prior Publication Data

US 2009/0311821 A1  Dec. 17, 2009

(51) Int. Cl.
 *H01L 31/0236* (2006.01)
(52) U.S. Cl. .................... 438/71; 438/72; 438/745
(58) Field of Classification Search .............. 438/745, 438/597, 753; 428/317.9
 See application file for complete search history.

(56) References Cited

U.S. PATENT DOCUMENTS

| 6,790,785 B1 | 9/2004 | Li et al. |
| 7,135,414 B2 | 11/2006 | Matsumura et al. |
| 2011/0143484 A1* | 6/2011 | Lin et al. ............. 438/72 |

FOREIGN PATENT DOCUMENTS

WO  2007/025536  3/2007

OTHER PUBLICATIONS

Hadjersi et al. Metal-assisted chemical etching in HF/Na2S2O8 or HF/KMnO4 produces porous silicon, Mar. 5, 2004, Thin Solid Films, 459, p. 271-275.*
Kolasinski, Silicon nanostructures from electroless electrochemical etching, 2005, Solid State and Materials Science, 9, p. 73-83.*
Douauni et al. Formation of aligned silicon-nanowire on silicon in aqueous HF/(AgNO3+Na2S2O8) solution, May 20, 2008, Applied Surface Science, 254, p. 7219-7222.*
Article titled "Metal-Assisted Wet Chemical Etching of Crystalline Silicon" authored by Chartier, et al., 22nd European Photovoltaic Solar Energy Conference, Sep. 3-7, 2007, Milan, Italy pp. 1231-1234.

* cited by examiner

*Primary Examiner* — Duy Deo
*Assistant Examiner* — Erin Flanagan
(74) *Attorney, Agent, or Firm* — J.C. Patents

(57) ABSTRACT

A method for producing a silicon substrate for solar cells is provided. The method includes performing a saw damage removal (SDR) and surface macro-texturing on a silicon substrate with acids solution, so that a surface of the silicon substrate becomes an irregular surface. Thereafter, a metal-activated selective oxidation is performed on the irregular surface with an aqueous solution containing an oxidant and a metal salt, in which the oxidant is one selected from persulfate ion, permanganate ion, bichromate ion, and a mixture thereof. Afterwards, the irregular surface is etched with an aqueous solution containing HF and $H_2O_2$ so as to form a nano-texturized silicon substrate.

14 Claims, 4 Drawing Sheets

METHOD FOR PRODUCING SILICON SUBSTRATE FOR SOLAR CELLS

BACKGROUND OF THE INVENTION

1. Field of the Invention

The present invention generally relates to a method for producing a silicon substrate for solar cells.

2. Description Of Related Art

Solar cell is a very promising clean energy source, which can generate electricity directly from sunlights. However, the cost of the production of solar cells needs to be significantly reduced, so that the solar cells can be widely accepted as a major electricity source. Study shows that the silicon wafer share occupies over one third of the total cost of a crystal silicon (c-Si) solar cell module. Consequently, in order to reduce the cost, it has become an important development trend to make solar cells by multicrystalline silicon (mc-silicon) thin film.

Recently, all high-efficiency mono-crystalline silicon solar cells have a particular textured structure on the front surface, so as to reduce the reflection loss and to improve the light-trapping property. Currently, the most effective texturization method is to etch pyramids on mono-crystalline wafers with <100> surface orientation, in which method alkaline etching solutions of potassium hydroxide (KOH) or sodium hydroxide (NaOH) with anisotropic etching rates, where the etching rate of <111> planes are slower than that on <100> and <110> planes by two orders of magnitude are used. Therefore, randomly distributed pyramids are formed through intersecting <111> planes, which are called random pyramids, or inverted pyramids structure is formed by using a cross-hatched masking layer. Although the above method is an elegant and effective method for forming the surface texture of the mono-crystalline wafer, it is not suitable for the multicrystalline wafer, since the grains have different orientations. When the conventional alkaline etching technique is used, the random grain orientations of the multi-crystalline silicon wafer have an inhibited effect in forming the uniform and effective surface configuration. Therefore, the isotropic etching or other approaches that are not affected by the crystal orientation must be adopted to configure the above surface.

As for a wet chemical isotropic etching of multicrystalline silicon, hydrofluoric acid (HF) and nitric acid ($HNO_3$) are appropriate, and such an etching process provides an undamaged smooth surface and achieves almost uniform reflectance distribution on the wafer surface. The reaction of these acids with silicon is strongly exothermic, so that phosphoric acid ($H_3PO_4$) or acetic acid ($CH_3COOH$) may be added therein to control the etching process. However, the surface may become smoother and the reflectivity may be increased instead of decreased. Therefore, a surface-active agent is generally added into the etching solution to enhance the bubble-masking effect.

In addition, a wet chemical approach for texturing multicrystalline silicon has been disclosed in U.S. Pat. No. 6,790,785, where a nanometer-scale porous layer is etched on a multicrystalline silicon surface. A weighted reflectivity value obtained by this approach is reduced to 9%, but the short-circuit current density of the solar cell is significantly reduced. That's because the porous silicon etching may result in poor surface passivation and high absorption coefficient for short wavelength photons. Furthermore, as the direct band-gap behavior of the short wavelength response is reduced, the porous silicon layer has a appreciable absorption loss.

Furthermore, in some research, the silicon surface is textured by disposing first a metal-containing layer, for example, as disclosed in WO 2007/025536, the etching process being performed with a solution containing HF or $NH_4F$, as well as an oxidant. However, it is quite complicated to control the thickness of the metal-containing layer in terms of a large surface area.

SUMMARY OF THE INVENTION

Accordingly, the present invention is directed to a method for producing a silicon substrate for solar cells, which can easily achieve the surface morphology and optical properties required by a multicrystalline silicon substrate.

The present invention provides a method for producing a silicon substrate for solar cells, which includes the following steps. First, a saw damage removal (SDR) and surface macro-texturing are performed on a silicon substrate with an acids solution, such that a surface of the silicon substrate becomes an irregular surface. Next, a metal-activated selective oxidation is performed on the irregular surface with an aqueous solution containing an oxidant and a metal salt, in which the oxidant is one selected from a group consisting of persulfate ion, permanganate ion, bichromate ion, and any mixture thereof. After that, the irregular surface is etched with an aqueous solution containing HF and $H_2O_2$, so as to form a nano-texturized silicon substrate.

In the present invention, the electroless wet chemistry technique using the aqueous solution is adopted during the whole producing process, and through performing the simple and robustly developed metal-activated selective oxidation and etching process, the suitable surface morphology and optical properties of the silicon substrate may be respectively obtained through using the selective oxidation solution composition, and through controlling the type of the oxidant as well as the etching time.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
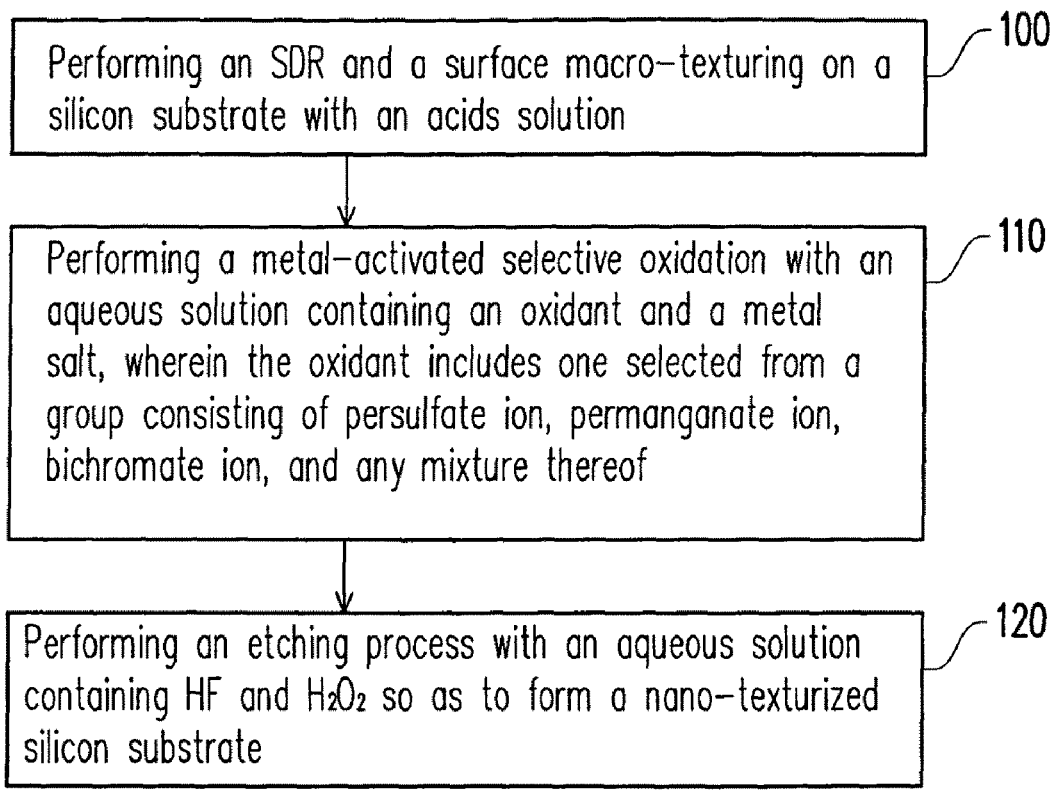
FIG. 1 is a flow chart for producing a silicon substrate for solar cells according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart for producing a silicon substrate for solar cells according to an embodiment of the present invention.

Referring to FIG. 1, first, a pre-treatment in Step 100 is performed, in which a SDR and a surface macro-texturing are performed on a silicon substrate with an acids solution, such that a surface of the silicon substrate becomes an irregular surface. The acids solution used for forming the irregular surface is, for example, an aqueous solution containing HF and $HNO_3$ or a solution only containing HF and $HNO_3$. The surface of the silicon substrate may become a rough or polished surface, according to the type of acids solution.

After Step 100 and before the subsequent steps, first, an aqueous solution containing potassium hydroxide is selected for performing etching, so as to remove, for example, a nano-porous silicon layer.

Then, an oxidation is performed in Step 110, in which a metal-activated selective oxidation is performed with an aqueous solution containing an oxidant and a metal salt at room temperature without electrical bias or illumination. The oxidant includes one selected from a group consisting of persulfate ion, permanganate ion, bichromate ion, and any mixture thereof. The duration of the metal-activated selective oxidation is about 5-10 minutes, for example. In the aqueous solution containing the oxidant and the metal salt, the metal salt is, for example, a water-soluble silver salt, for example, $AgNO_3$. When the aqueous solution used in the metal-activated selective oxidation includes sodium persulfate ($Na_2S_2O_8$) and silver nitrate ($AgNO_3$), the molar ratio of $Na_2S_2O_8$ to $AgNO_3$ is for example 2:1 to 20:1.

Next, an etching process in Step 120 is performed, in which the etching process is performed with the aqueous solution containing HF and $H_2O_2$, so as to form a nano-texturized silicon substrate. The above etching process is generally performed without electrical bias or illumination at room temperature. The process for etching the irregular surface lasts for about 5-10 minutes, for example.

In addition, after the formation of the nano-texturized silicon substrate, a concentrated $HNO_3$ solution may be optionally used to remove undesired metal/metal salts contaminations generated from the preceding steps. Alternatively, after the nano-texturized silicon substrate has been formed, the metal/metal salts contaminations are removed with $NH_4OH$ and HPM solution (the solution formed by mixing hydrochloric acid, $H_2O_2$, and pure water).

To explain the principle of the metal-activated selective oxidation in Step 110 of this embodiment. The persulfates are taken as an example below to demonstrate the oxidation reaction.

The persulfate anion is the most powerful oxidant in the peroxygen compounds. The standard oxidation-reduction potential of the following Scheme (1) is 2.1 V, as compared to 1.8 V for $H_2O_2$, and 1.4 V for peroxymonosulfate ($HSO^{5-}$).

(1)

In addition, to the direct oxidation persulfates may be activated to form sulfate radicals, thereby providing a radical reaction mechanism. Sulfate radicals are generated according to Scheme (2) below.

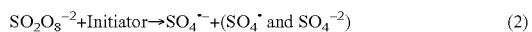
(2)

The sulphate radicals are one of the most powerful aqueous oxidizing species, and have an oxidation-reduction potential of about 2.6 V, which is similar to 2.7 V of the hydroxyl radicals.

In addition to the oxidizing strength, the persulfate radical and sulfate radical oxidation has many advantages, for example, the oxidation process is quite fast and the sulfate radicals are much more stable than the hydroxyl radicals.

The sulfate radical initiation can be achieved simply through heat, metal catalyst, or UV radiation. As for the mass production of large area elements (for example, solar cells), the metal catalyst is more suitable. Therefore, in the above initiation, the reactions of the following Scheme (3) and Scheme (4) may be performed through the metal salt (for example, water-soluble silver salt) and persulfate (for example, $Na_2S_2O_8$).

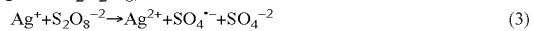
(3)

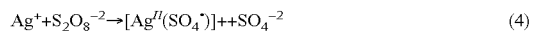
(4)

In the following, several examples are performed to prove the effects of this embodiment.

Example 1

As-cut multicrystalline silicon substrates are rinsed with acetone and methanol or through a Piranha process. Then, the silicon substrates are etched for about 3 minutes under a temperature of 5-8° C. through using a solution of $HF:HNO_3:H_2O$ at a volume ratio of 2.5:1:2.5, so as to perform the SDR and surface macro-texturing. Then, the silicon substrates are shortly immersed in a solution of $KOH:H_2O$ at a volume ratio of 1:50, so as to remove the formed nano-porous silicon layer. Then, the silicon substrates are rinsed with deionized water and then dried in a $N_2$ flow.

Thereafter, the silicon substrates are first dipped in HF for 2-3 minutes in order to remove the native oxide layer, and then the metal-activated selective oxidation is performed. The metal-activated selective oxidation is performed by putting the silicon substrate into a solution of 0.1 M $Na_2S_2O_8$ and 0.1 M $AgNO_3$ at a volume ratio of 2:1 while stirring mildly at room temperature. The duration of the whole metal-activated selective oxidation is approximately 5-10 minutes, and then the silicon substrates are rinsed with the deionized water and then dried in the $N_2$ flow.

Then, the silicon substrates after the selective oxidation are put into the aqueous solution containing HF and $H_2O_2$ (the volume ratio of $HF:H_2O_2:H_2O$ is 1:5:10) to be etched for approximately 5-10 minutes at room temperature, and then rinsed with deionized water and dried in the $N_2$ flow.

Afterwards, the concentrated $HNO_3$ solution is optionally used to remove the residual silver, and then the silicon substrates are rinsed with the deionized water. Finally, the HPM solution is added to remove the remaining contaminations for approximately 20 minutes at 80° C.

Figure 2:
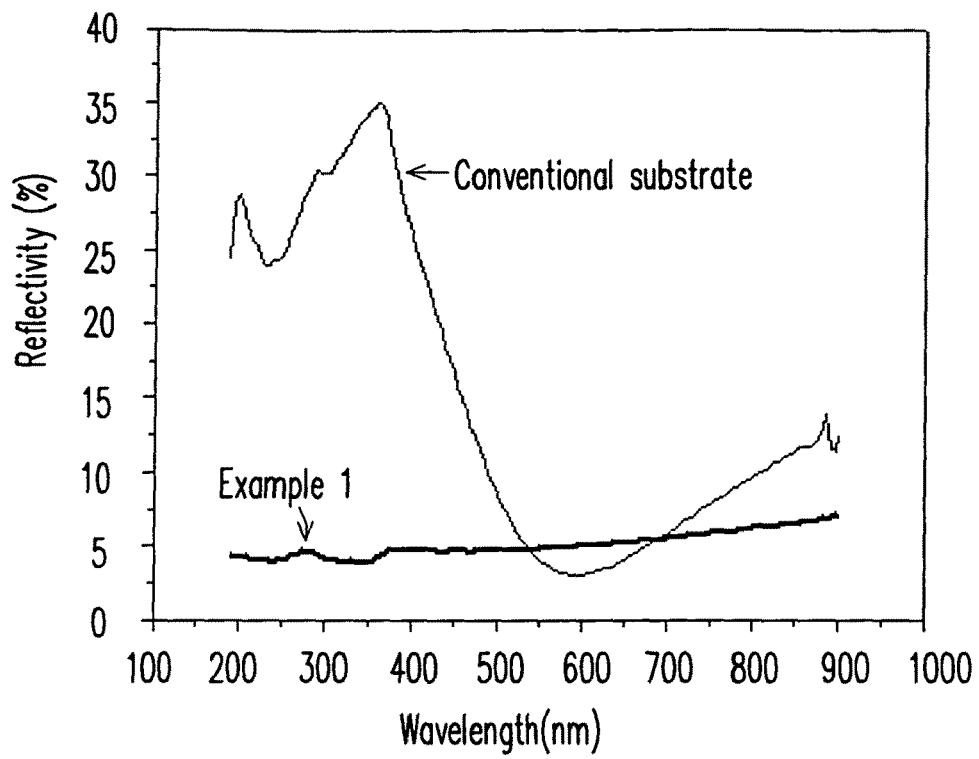
FIG. 2 is a graphical plot of a reflectivity dependence on wavelength when an incident light is respectively irradiated on the silicon substrate of Example 1 and the reflectivity of conventional mc-Si wafer substrate coated with an anti-reflection (AR) film.

FIG. 2 is a graphical plot of reflectivity as a function of wavelength when an incident light is respectively irradiated on the silicon substrate of Example 1 and the reflectivity of conventional mc-Si substrate coated with an anti-reflection (AR) film. The result shows that, the silicon substrate obtained according to the method of the present invention has broadband reflectivity suppression, and has better absorption of lights as compared with the conventional silicon substrate coated with the AR.

Example 2

The pre-treatments in Table 1 are respectively performed on different multicrystalline silicon substrates.

TABLE 1

| SDR | Polishing |
|---|---|
| HF:HNO$_3$:H$_2$O = 2.5:1:2.5 | HF:HNO$_3$ = 1:25 |
| 5-8° C., 3 minutes | 3-5 minutes, at room temperature |

Then, the silicon substrates after being processed by different pre-treatments are soaked in HF for 2-3 minutes, for removing the native oxide layer, and then the silicon substrates are macro-texturized or polished. Then, the metal-activated selective oxidation is performed by putting the silicon substrates into the solution of 0.1 M Na$_2$S$_2$O$_8$ and 0.1 M AgNO$_3$ at a volume ratio of 5:1 at room temperature under agitation. The whole metal-activated selective oxidation is finished after approximately 5 minutes, and then the silicon substrates are rinsed with deionized water and then dried in the N$_2$ flow.

Afterwards, the silicon substrates after the oxidation are put into the aqueous solution containing HF and H$_2$O$_2$ (the volume ratio of HF:H$_2$O$_2$:H$_2$O is 1:5:10), and then etched for approximately 6 minutes at room temperature, then rinsed with the deionized water and dried in the N$_2$ flow.

Figure 3:
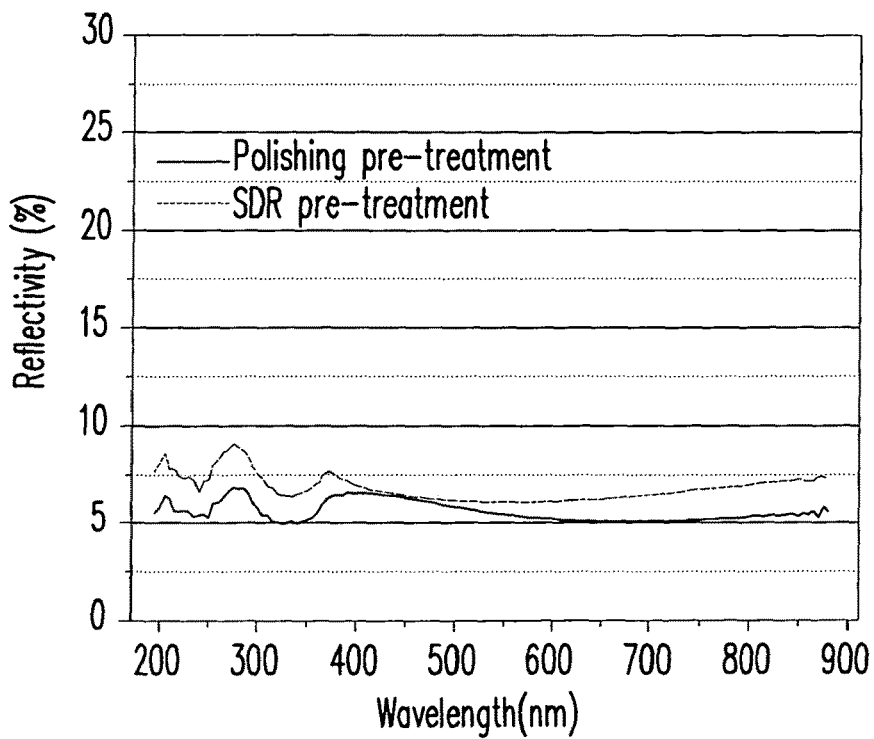
FIG. 3 is a graphical plot of the reflectivity to the wavelength when an incident light is respectively irradiated on the silicon substrate of Example 2 after being processed by two kinds of pre-treatments.

FIG. 3 is a graphical plot of reflectivity versus wavelength when an incident light is respectively irradiated on the silicon substrate of Example 2 after being processed by two kinds of pre-treatments. The result shows that, no matter whether the polishing process is performed or not, the obtained silicon substrates have similar optical properties.

Example 3

The multicrystalline silicon substrates are produced through the manner of Example 1, but in the metal-activated selective oxidation process, Na$_2$S$_2$O$_8$ and AgNO$_3$ at the volume ratio of 10:1 is used.

Figure 4A:
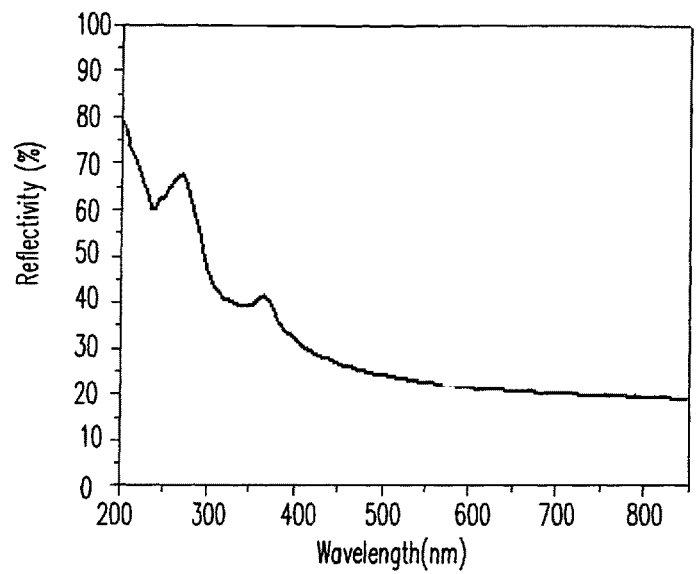
FIG. 4A is a graphical plot of the reflectivity to the wavelength after merely the SDR and the macro-texturing step are finished and after the nano-porous silicon layer is removed.
Figure 4B:
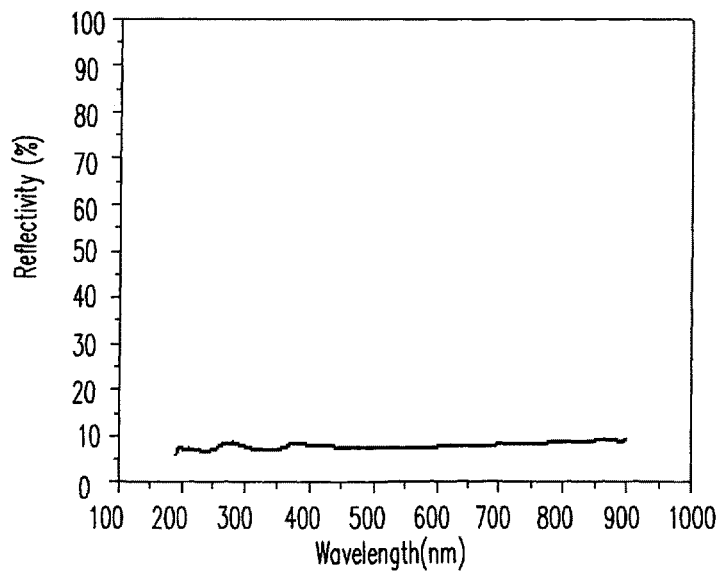
FIG. 4B is a graphical plot of the reflectivity to the wavelength after all the steps of Example 3 are finished.
Figure 5A:
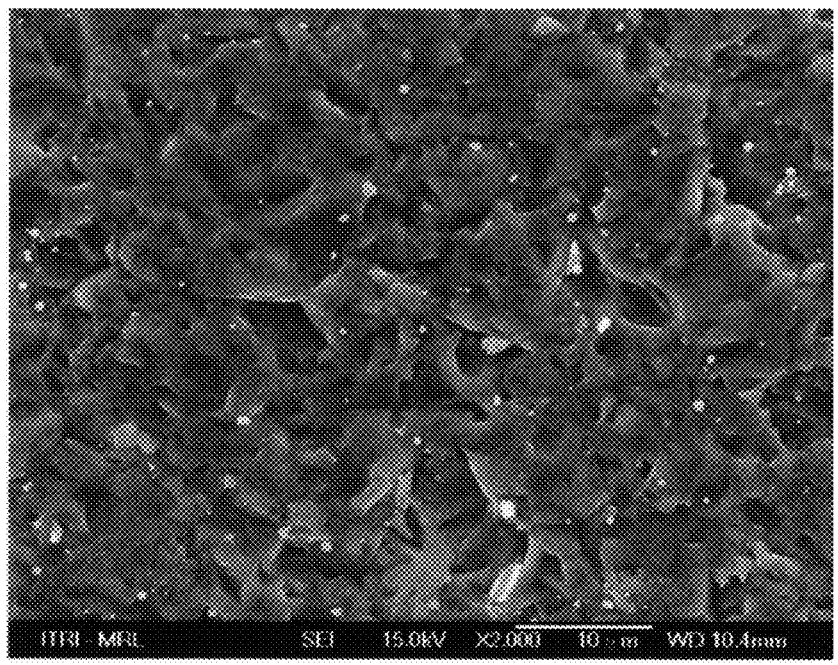
FIG. 5A is an SEM picture of the surface of the silicon substrate in the stage of FIG. 4A.
Figure 5B:
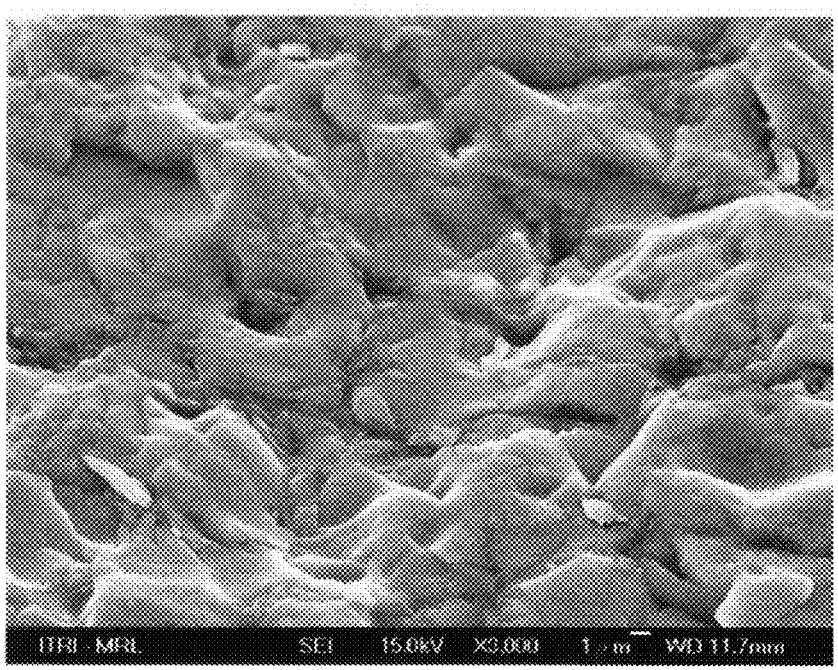
FIG. 5B is an SEM picture of the surface of the silicon substrate in the stage of FIG. 4B.

FIG. 4A is a graphical plot of reflectivity vs. wavelength after merely the SDR and the macro-texturing step are finished and after the nano-porous silicon layer is removed, and FIG. 4B is a graphical plot of reflectivity to wavelength after finishing all the steps. As can be known by comparing FIG. 4A with FIG. 4B that, only after the metal-activated selective oxidation and the etching process are performed on the silicon substrates, the reflectivity suppression effect can be achieved in the whole measured interval of wavelengths. FIGS. 5A and 5B are respectively SEM pictures of the surface of the silicon substrate at the stages of FIGS. 4A and 4B.

To sum up, in the present invention, the reflectivity can be easily reduced through a procedure consisting of as simple process steps as possible, which is more easily achieved especially on the large surface processing. In addition, surface texture with a size of even below 1 micrometer can be produced in the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for producing a silicon substrate for solar cells, comprising:

performing a saw damage removal (SDR) and a surface macro-texturing on a silicon substrate with an acids solution, such that a surface of the silicon substrate becomes an irregular surface;

performing a metal-activated selective oxidation on the irregular surface with an aqueous solution containing an oxidant and a metal salt, wherein the oxidant is one selected from a group consisting of persulfate ion, permanganate ion, bichromate ion, and a mixture thereof; and etching the irregular surface with an aqueous solution containing hydrofluoric acid (HF) and hydrogen peroxide (H$_2$O$_2$) after the metal-activated selective oxidation, so as to form a nano-texturized silicon substrate.

2. The method for producing a silicon substrate for solar cells according to claim 1, wherein the metal-activated selective oxidation is performed without electrical bias or illumination at room temperature.

3. The method for producing a silicon substrate for solar cells according to claim 1, wherein a duration of the metal-activated selective oxidation is about 5-10 minutes.

4. The method for producing a silicon substrate for solar cells according to claim 1, wherein the metal salt in the aqueous solution used in the metal-activated selective oxidation comprises a water-soluble silver salt.

5. The method for producing a silicon substrate for solar cells according to claim 4, wherein the water-soluble silver salt comprises AgNO$_3$.

6. The method for producing a silicon substrate for solar cells according to claim 1, wherein the aqueous solution used in the metal-activated selective oxidation comprises sodium persulfate (Na$_2$S$_2$O$_8$) and silver nitrate (AgNO$_3$).

7. The method for producing a silicon substrate for solar cells according to claim 6, wherein a molar ratio of Na$_2$S$_2$O$_8$ to AgNO$_3$ in the aqueous solution is about 2:1 to 20:1.

8. The method for producing a silicon substrate for solar cells according to claim 1, wherein the step of etching the irregular surface is performed without electrical bias or illumination at room temperature.

9. The method for producing a silicon substrate for solar cells according to claim 1, wherein a duration of etching the irregular surface is about 5-10 minutes.

10. The method for producing a silicon substrate for solar cells according to claim 1, wherein the acids solution comprises an aqueous solution containing HF and nitric acid (HNO$_3$).

11. The method for producing a silicon substrate for solar cells according to claim 1, wherein the acids solution comprises a solution containing HF and HNO$_3$.

12. The method for producing a silicon substrate for solar cells according to claim 1, further comprises rinsing the irregular surface with an aqueous solution containing potassium hydroxide after forming the irregular surface and before performing the metal-activated selective oxidation.

13. The method for producing a silicon substrate for solar cells according to claim 1, further comprises removing undesired metal/metal salts contamination generated with a concentrated HNO$_3$ solution after forming the nano-texturized silicon substrate.

14. The method for producing a silicon substrate for solar cells according to claim 1, further comprises removing undesired metal/metal salts contaminations with NH$_4$OH and HPM solution after forming the nano-texturized silicon substrate.

* * * * *